United States Patent
Ching et al.

(10) Patent No.: US 9,627,264 B2
(45) Date of Patent: Apr. 18, 2017

(54) SEMICONDUCTOR DEVICE AND FORMATION THEREOF

(71) Applicant: Taiwan Semiconductor Manufacturing Company Limited, Hsin-Chu (TW)

(72) Inventors: Kuo-Cheng Ching, Zhubei (TW); Guan-Lin Chen, Baoshan Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/214,826

(22) Filed: Jul. 20, 2016

(65) Prior Publication Data

US 2016/0329250 A1    Nov. 10, 2016

Related U.S. Application Data

(60) Division of application No. 14/461,502, filed on Aug. 18, 2014, now Pat. No. 9,406,778, which is a continuation-in-part of application No. 14/155,793, filed on Jan. 15, 2014, now Pat. No. 9,257,559.

(51) Int. Cl.
*H01L 21/8238* (2006.01)
*H01L 21/8234* (2006.01)
*H01L 29/66* (2006.01)
*H01L 29/78* (2006.01)

(52) U.S. Cl.
CPC .. *H01L 21/823431* (2013.01); *H01L 29/6656* (2013.01); *H01L 29/66545* (2013.01); *H01L 29/66818* (2013.01); *H01L 29/785* (2013.01); *H01L 29/7843* (2013.01); *H01L 29/7846* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 7,939,406 B2 | 5/2011 | Matsui et al. | |
| 8,901,607 B2 | 12/2014 | Wang et al. | |
| 9,006,786 B2 | 4/2015 | Ching et al. | |
| 2014/0197457 A1 | 7/2014 | Wang et al. | |

*Primary Examiner* — Sonya D McCall Shepard
(74) *Attorney, Agent, or Firm* — Cooper Legal Group, LLC

(57) ABSTRACT

A semiconductor device and method of formation are provided herein. A semiconductor device includes a fin having a doped region, in some embodiments. The semiconductor device includes a gate over a channel portion of the fin. The gate including a gate electrode over a gate dielectric between a first sidewall spacer and a second sidewall spacer. The first sidewall spacer includes an initial first sidewall spacer over a first portion of a dielectric material. The second sidewall spacer includes an initial second sidewall spacer over a second portion of the dielectric material.

20 Claims, 16 Drawing Sheets

SEMICONDUCTOR DEVICE AND FORMATION THEREOF

RELATED APPLICATIONS

This application is a divisional of and claims priority to U.S. patent application Ser. No. 14/461,502, titled "SEMICONDUCTIVE DEVICE AND FORMATION THEREOF" and filed Aug. 18, 2014. U.S. patent application Ser. No. 14/461,502 is a continuation-in-part of and claims priority to U.S. patent application Ser. No. 14/155,793, titled "SEMICONDUCTOR DEVICE AND FORMATION THEREOF" and filed Jan. 15, 2014. U.S. patent application Ser. Nos. 14/461,502 and 14/155,793 are incorporated herein by reference.

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
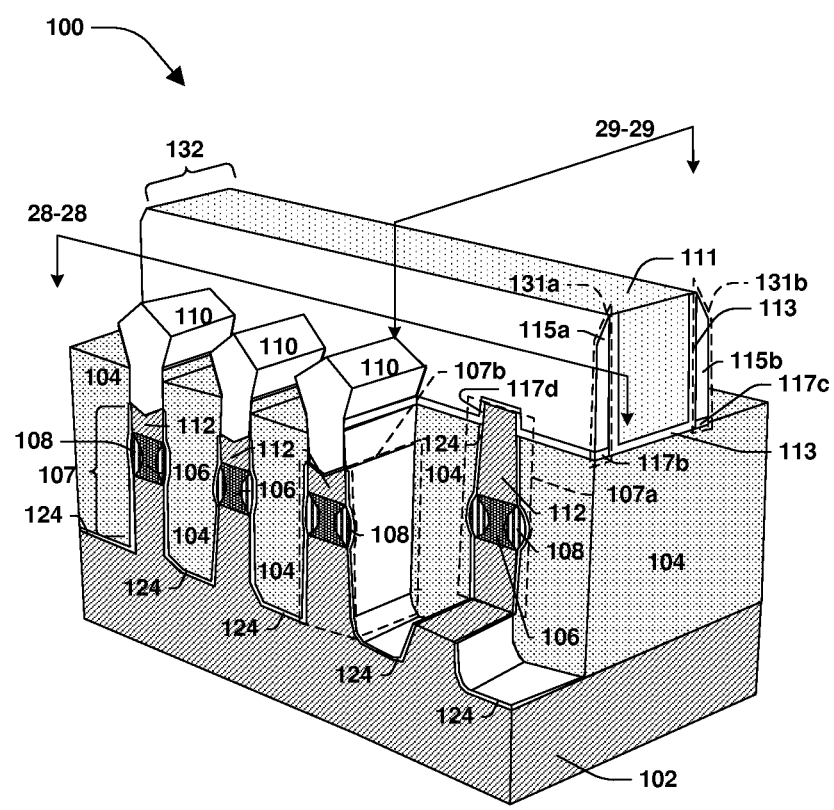
FIG. 1 is a 3D illustration of a semiconductor device at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein. Some embodiments of the present disclosure have one or a combination of the following features and/or advantages.

According to some embodiments, a method of forming a semiconductor device comprises forming a doped region in a fin and oxidizing the fin. In some embodiments, oxidizing the fin forms a dielectric feature on an outer surface of the doped region. In some embodiments, a dielectric material is formed over the fin. In some embodiments, the dielectric material comprises at least one of silicon nitride, aluminum oxide or silicon oxy nitride. In some embodiments, a dummy gate is formed over at least some of the dielectric material over a channel portion of the fin. In some embodiments, the dummy gate comprises a dummy poly, an initial first sidewall spacer adjacent the dummy poly and an initial second sidewall spacer adjacent the dummy poly. In some embodiments, the dummy gate comprises a hard mask over the dummy poly and between the initial first sidewall spacer and the initial second sidewall spacer. In some embodiments, a fin height of at least one of a first non-channel portion of the fin or a second non-channel portion of the fin is reduced. In some embodiments, the reducing comprises removing at least some of the dielectric material over at least one of the first non-channel portion or the second non-channel portion. In some embodiments, an epitaxial (epi) cap is formed over at least one of the reduced first non-channel portion or the reduced second non-channel portion. In some embodiments, the dummy poly and a portion of the dielectric material are removed from between the initial first sidewall spacer and the initial second sidewall spacer to form a first sidewall spacer and a second sidewall spacer. In some embodiments, the first sidewall spacer comprises a first portion of the dielectric material under the initial first sidewall spacer and the initial first sidewall spacer. In some embodiments, the second sidewall spacer comprises a second portion of the dielectric material under the initial second sidewall spacer and the initial second sidewall spacer. In some embodiments, a gate dielectric is formed between the first sidewall spacer and the second sidewall spacer. In some embodiments, a gate electrode is formed over the gate dielectric to form a gate. In some embodiments, the dielectric material inhibits dopant migration during at least one of dummy gate formation, epi cap formation, etching to reduce the fin height, etc. In some embodiments, inhibiting dopant migration forms a more uniform channel as compared to a device in which dopant migration is not so inhibited.

Turning to FIG. 1, a 3D rendering of a semiconductor device 100 is illustrated. In some embodiments, the semiconductor device 100 comprises a fin 107. In FIG. 1, the semiconductor device 100 is illustrated as comprising multiple fins or multiple instances of the fin, where a portion of one of the fins is removed for illustrative purposes. In some embodiments, the fin 107 comprises a dielectric feature 108 adjacent a doped region 106. In some embodiments, the fin 107 comprises at least some of a substrate 102 and a second substrate layer 112. In some embodiments, a dielectric layer 124 is on at least some of sidewalls of the fin 107. In some embodiments, a gate 132 is over a channel portion 107a of the fin 107. In some embodiments, the gate 132 comprises a gate electrode 111 over a gate dielectric 113 between a first sidewall spacer 131a and a second sidewall spacer 131b. In some embodiments, the first sidewall spacer 131a comprises an initial first sidewall spacer 115a over a first portion 117b of a dielectric material 117. In some embodiments, the dielectric material 117 comprising at least one of silicon nitride, aluminum oxide or silicon oxy nitride. In some embodiments, the second sidewall spacer 131b comprises an initial second sidewall spacer 115b over a second portion 117c of the dielectric material 117. According to some embodiments, an interlayer dielectric (ILD) layer 104 is adjacent the fin 107 and an epitaxial (epi) cap 110 is over a first non-channel portion 107b of the fin 107. In some embodiments, a sidewall portion 117d of the dielectric material 117 is on at least some of a sidewall of the channel portion 107a of the fin 107.

Figure 28:
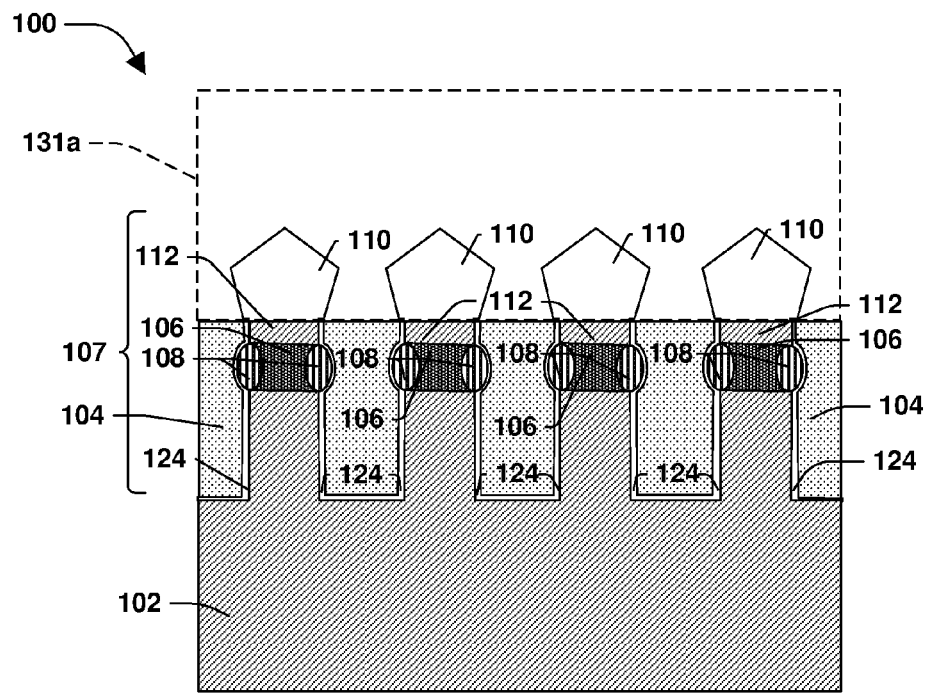
FIG. 28 is an illustration of a cross section of a semiconductor device at a stage of fabrication, in accordance with some embodiments.
Figure 29:
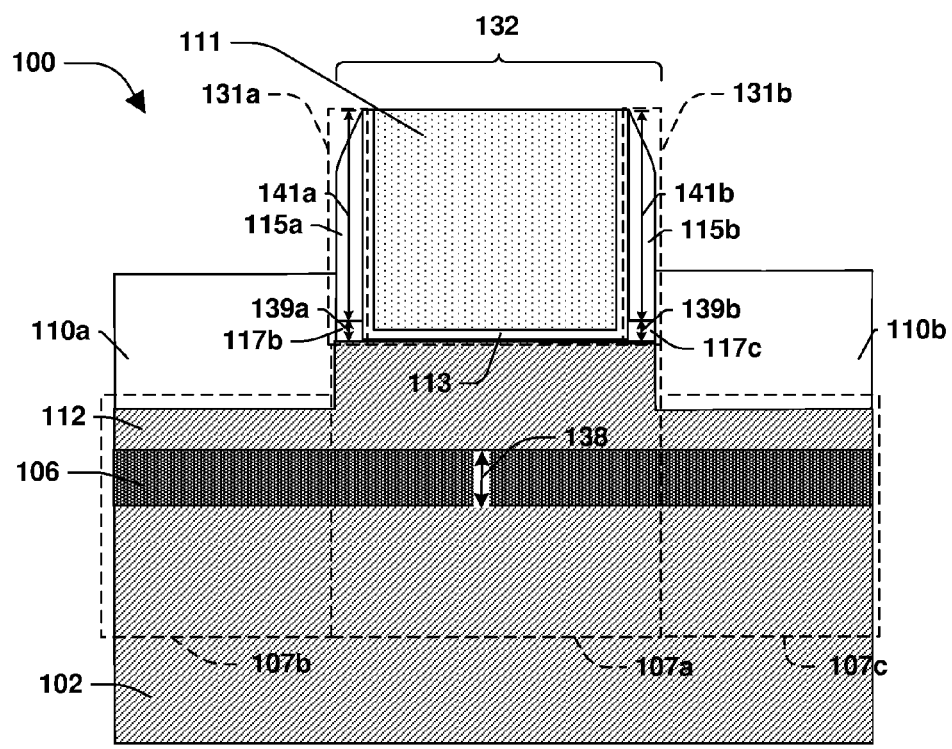
FIG. 29 is an illustration of a cross section of a semiconductor device at a stage of fabrication, in accordance with some embodiments.

In FIG. 1, a line 28-28 is drawn to illustrate a cross-section that is depicted in FIG. 28, according to some embodiments, where the portion of the fin that is removed in FIG. 1 is not removed in FIG. 28 and thus is depicted in FIG. 28. In FIG. 1, a line 29-29 is drawn to illustrate a cross-section that is depicted in FIG. 29, according to some embodiments, where the portion of the fin that is removed portion in FIG. 1 is not removed in FIG. 29 and thus is depicted in FIG. 29. In some embodiments, the line 28-28 depicts a view that cuts through multiple fins but that does not cut through the gate or sidewall spacers, and thus merely a dashed line indicating a side view of the first sidewall spacer 131a is illustrated in FIG. 28, where the first sidewall spacer 131a would be set back into the page in FIG. 28. FIGS. 2, 4, 6, 9, 12, 14, 16, 18, 20, 22, 24, 26, and 28 are cross sectional views of the semiconductor device 100 taken along the line 28-28 at various stages of fabrication. In some embodiments, the line 29-29 depicts a view that cuts through a single fin, but that does not cut through a dielectric feature 108 of the fin, and thus no dielectric feature 108 is illustrated in FIG. 29. FIGS. 3, 5, 7, 10, 13, 15, 17, 19, 21, 23, 25, 27, and 29 are cross sectional views of the semiconductor device 100 taken along the line 29-29 at various stages of fabrication.

Figure 2:
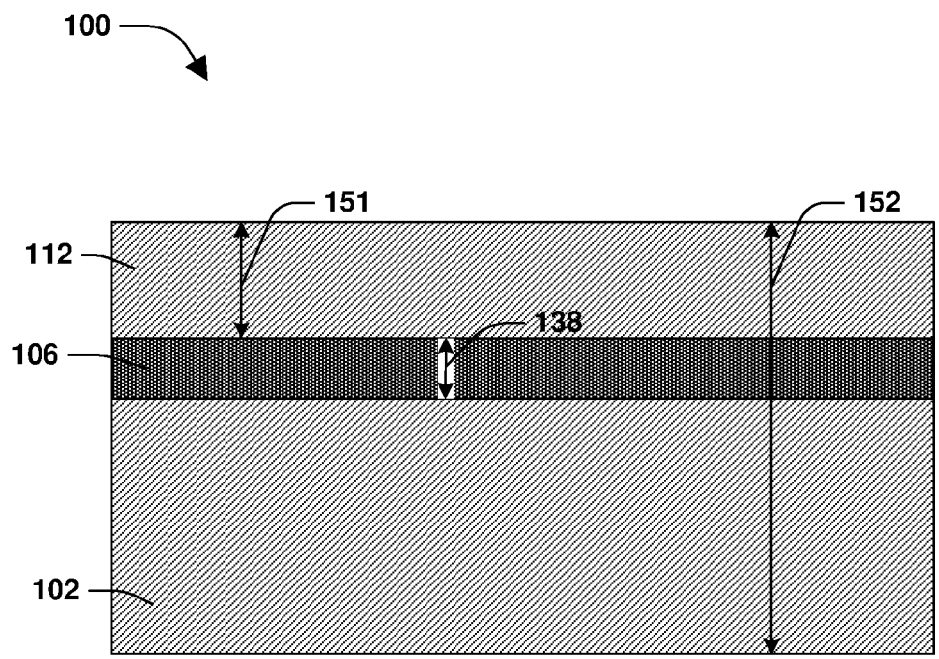
FIG. 2 is an illustration of a cross section of a semiconductor device at a stage of fabrication, in accordance with some embodiments.
Figure 3:
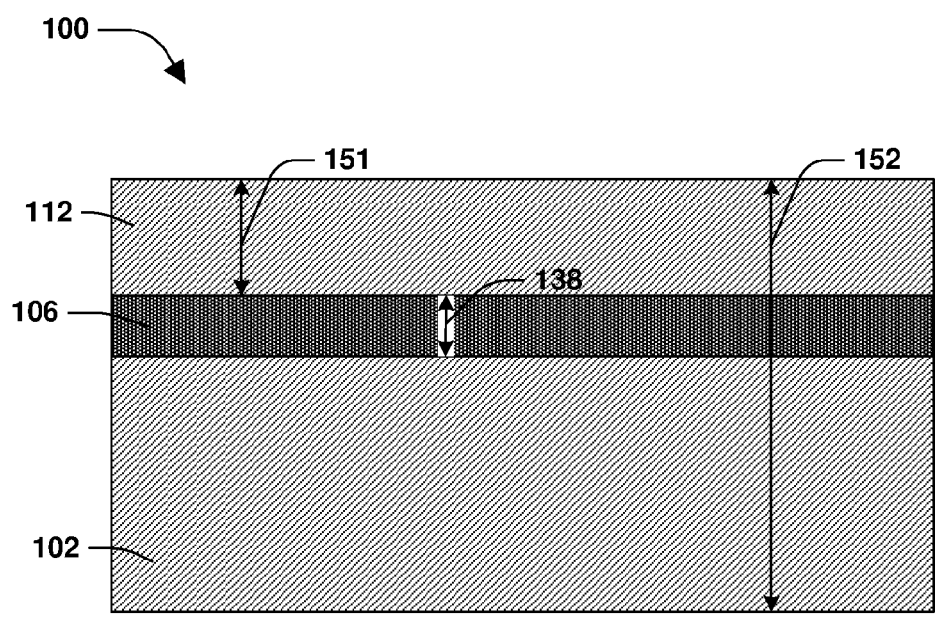
FIG. 3 is an illustration of a cross section of a semiconductor device at a stage of fabrication, in accordance with some embodiments.

Turning to FIGS. 2-3, the doped region 106 is formed over the substrate 102, according to some embodiments. In some embodiments, the substrate 102 comprises at least one of silicon, germanium, etc. According to some embodiments, the substrate 102 comprises at least one of an epitaxial layer, a silicon-on-insulator (SOI) structure, a wafer, or a die formed from a wafer. In some embodiments, the doped region 106 formed by at least one of growth, deposition, etc. In some embodiments, the doped region 106 is formed by at least one of atomic layer deposition (ALD), chemical vapor deposition (CVD), or physical vapor deposition (PVD). In some embodiments, the doped region 106 has a doped region height 138 between about 25 nm to about 45 nm. In some embodiments, the doped region 106 comprises at least one of silicon, germanium, etc. In some embodiments, the second substrate layer 112 is formed over the doped region 106. In some embodiments, the second substrate layer 112 comprises at least one of silicon, germanium, etc. In some embodiments, the second substrate layer 112 is formed by at least one of growth, deposition, etc. In some embodiments, the second substrate layer 112 is formed by at least one of ALD, CVD, or PVD. In some embodiments, the second substrate layer 112 has a second substrate height 151 between about 40 nm to about 100 nm. In some embodiments, a stack height 152 of the substrate 102, the doped region 106 and the second substrate layer 112 is between about 100 nm to about 500 nm.

Figure 4:
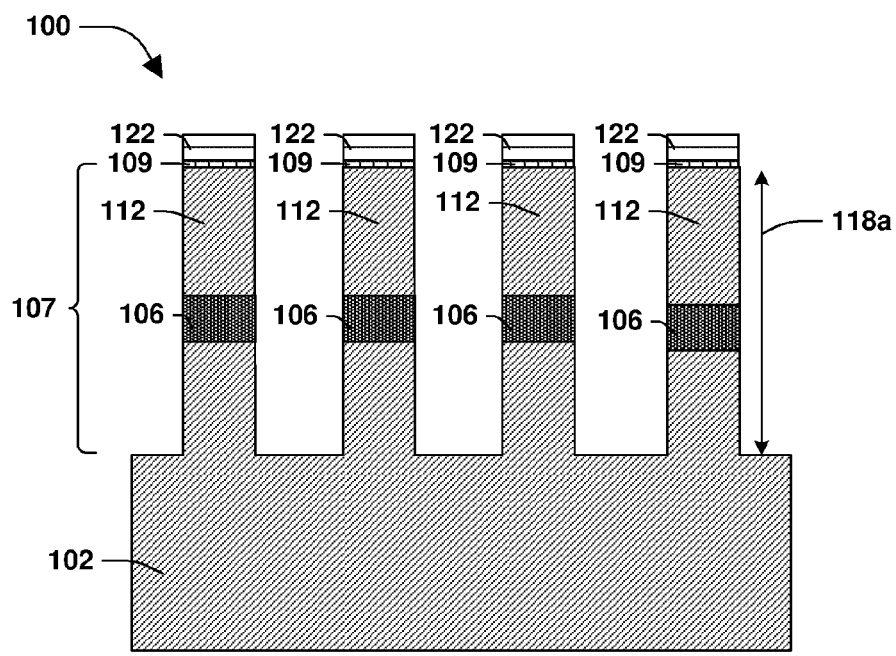
FIG. 4 is an illustration of a cross section of a semiconductor device at a stage of fabrication, in accordance with some embodiments.
Figure 5:
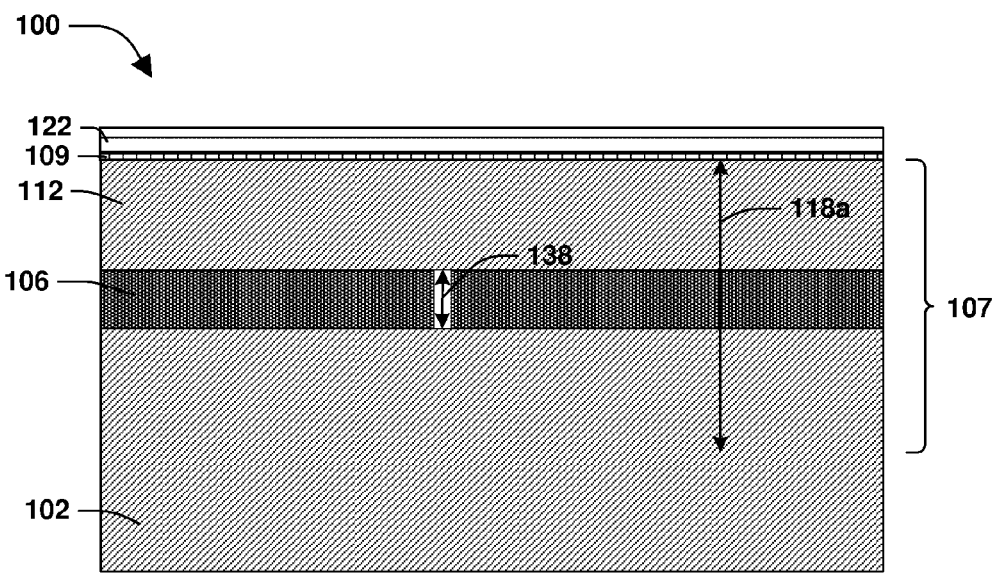
FIG. 5 is an illustration of a cross section of a semiconductor device at a stage of fabrication, in accordance with some embodiments.

Turning to FIGS. 4-5, a mask layer 109 is formed over the second substrate layer 112, according to some embodiments. In some embodiments, the mask layer 109 comprises an oxide. In some embodiments, the mask layer 109 has a thickness between about 1 nm to about 6 nm. In some embodiments, a fin hard mask 122 is formed over the mask layer 109. In some embodiments, the fin hard mask 122 comprises nitride. In some embodiments, the fin hard mask 122 has a thickness between about 15 nm to about 25 nm. In some embodiments, the fin 107 or multiple fins are formed, such as by etching, as illustrated in FIG. 4, where the fin hard mask 122 and the mask layer 109 are patterned to protect or define the fin 107 during the etching. In some embodiments, the fin 107 has a fin height 118*a* between about 140 nm to about 260 nm. In some embodiments, the fin 107 is formed without at least one of the mask layer 109 or the fin hard mask 122.

Figure 6:
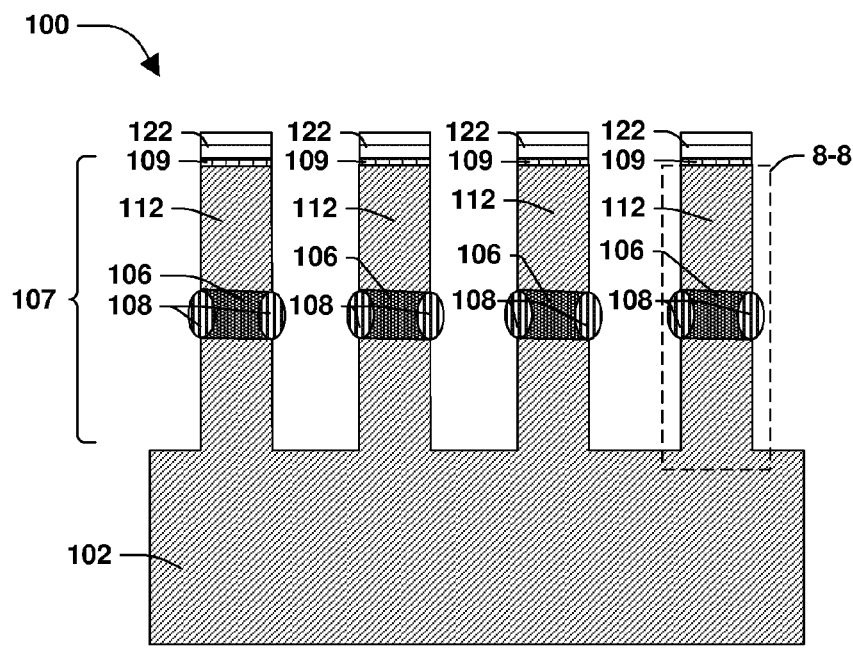
FIG. 6 is an illustration of a cross section of a semiconductor device at a stage of fabrication, in accordance with some embodiments.
Figure 7:
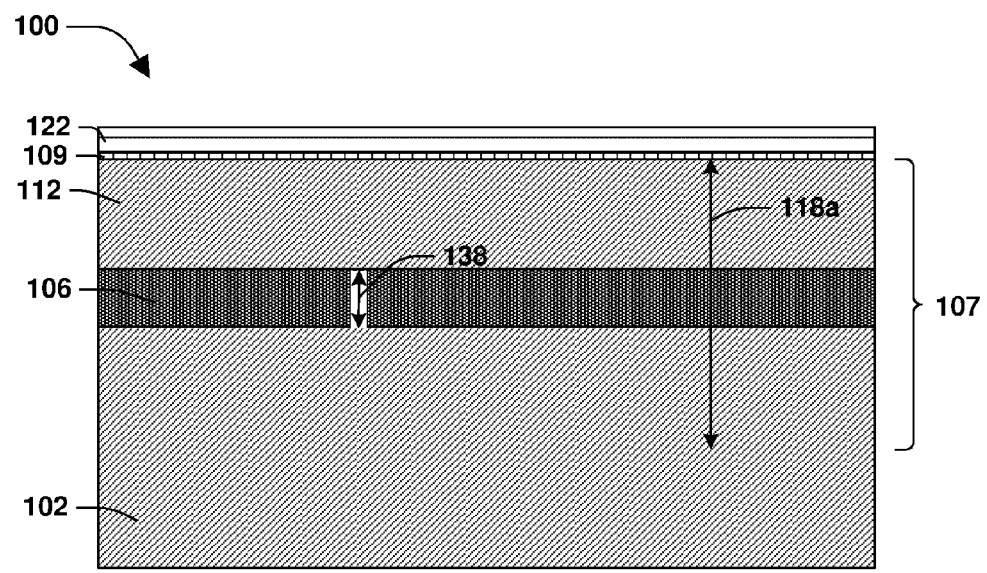
FIG. 7 is an illustration of a cross section of a semiconductor device at a stage of fabrication, in accordance with some embodiments.
Figure 8:
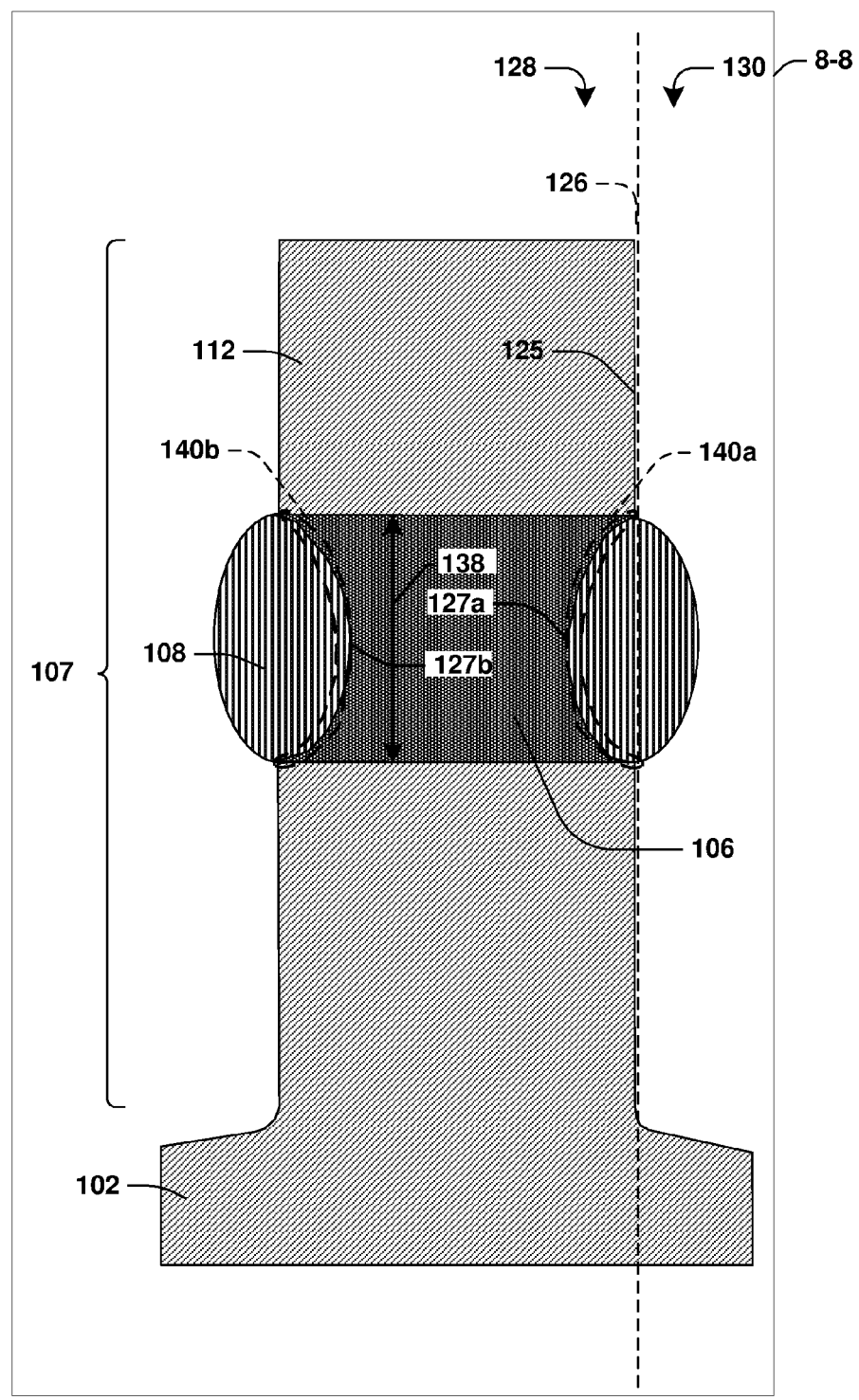
FIG. 8 is an illustration of a cross section of a semiconductor device at a stage of fabrication, in accordance with some embodiments.

Turning to FIGS. 6-8, the fin 107 is oxidized to form the dielectric feature 108 on sidewalls of the doped region 106, according to some embodiments. With reference to FIG. 8, which is a magnified fin or zoomed in view of the fin 107 encompassed by dashed box 8-8 of FIG. 6, the doped region 106 defines a first furrow 127*a* or concave surface, according to some embodiments. In some embodiments, the dielectric feature 108 is on a first outer surface 140*a* of the first furrow 127*a*. In some embodiments, the fin 107 is oxidized, such that the doped region 106 defines a second furrow 127*b* and such that the dielectric feature 108, or a second instance of the dielectric feature, is on a second outer surface 140*b* of the second furrow 127*b*. In some embodiments, the fin 107 is oxidized, such as by at least one of thermal oxidation, wet oxidation, etc. In some embodiments, thermal oxidation comprises applying $H_2O$ gas at a temperature between about 500° C. to about 1000° C. at a pressure between about 0.5 atm to about 2 atm to the semiconductor device 100. In some embodiments, a surface of the substrate 102 and a surface of the second substrate layer 112 are oxidized such that an oxidation layer (not shown) is formed on the surface of the substrate 102 and the surface of the second substrate layer 112. In some embodiments, the oxidation layer comprises at least one of silicon, oxide, etc. In some embodiments, the oxidation layer has a thickness between about 0.5 nm to about 3 nm. In some embodiments, the oxidation layer is removed. In some embodiments, the dielectric feature 108 comprises oxide and at least one of silicon, germanium, etc. In some embodiments, the fin 107 has a first wall 125 extending along a first plane 126, as illustrated in FIG. 8. In some embodiments, the dielectric feature 108 is convex and extends from the first furrow 127*a* such that the dielectric feature 108 extends from a first side 128 of the first plane 126 to a second side 130 of the first plane 126. In some embodiments, convex means a configuration comprising an external angle greater than about 180°.

Figure 9:
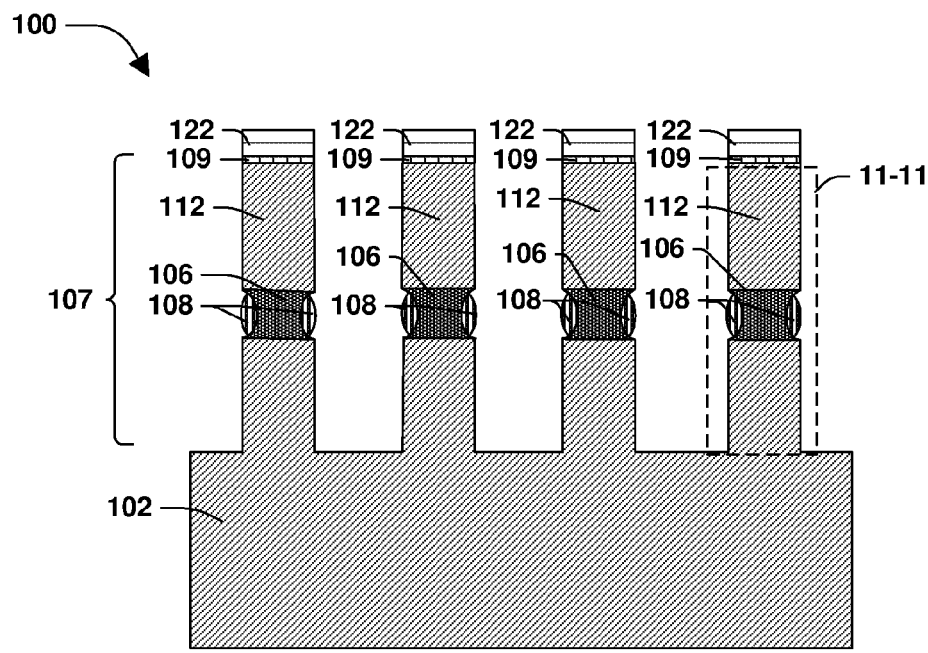
FIG. 9 is an illustration of a cross section of a semiconductor device at a stage of fabrication, in accordance with some embodiments.
Figure 10:
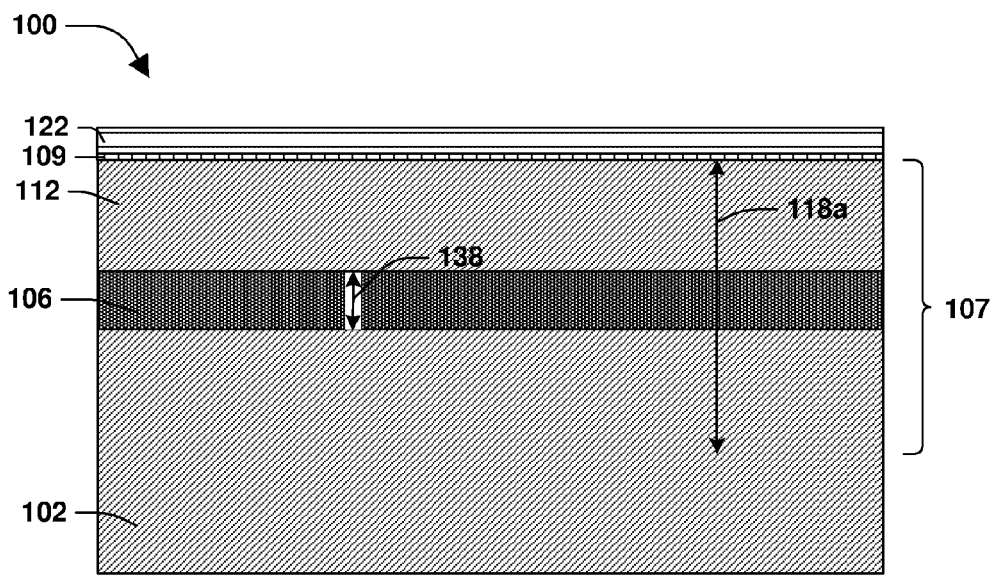
FIG. 10 is an illustration of a cross section of a semiconductor device at a stage of fabrication, in accordance with some embodiments.
Figure 11:
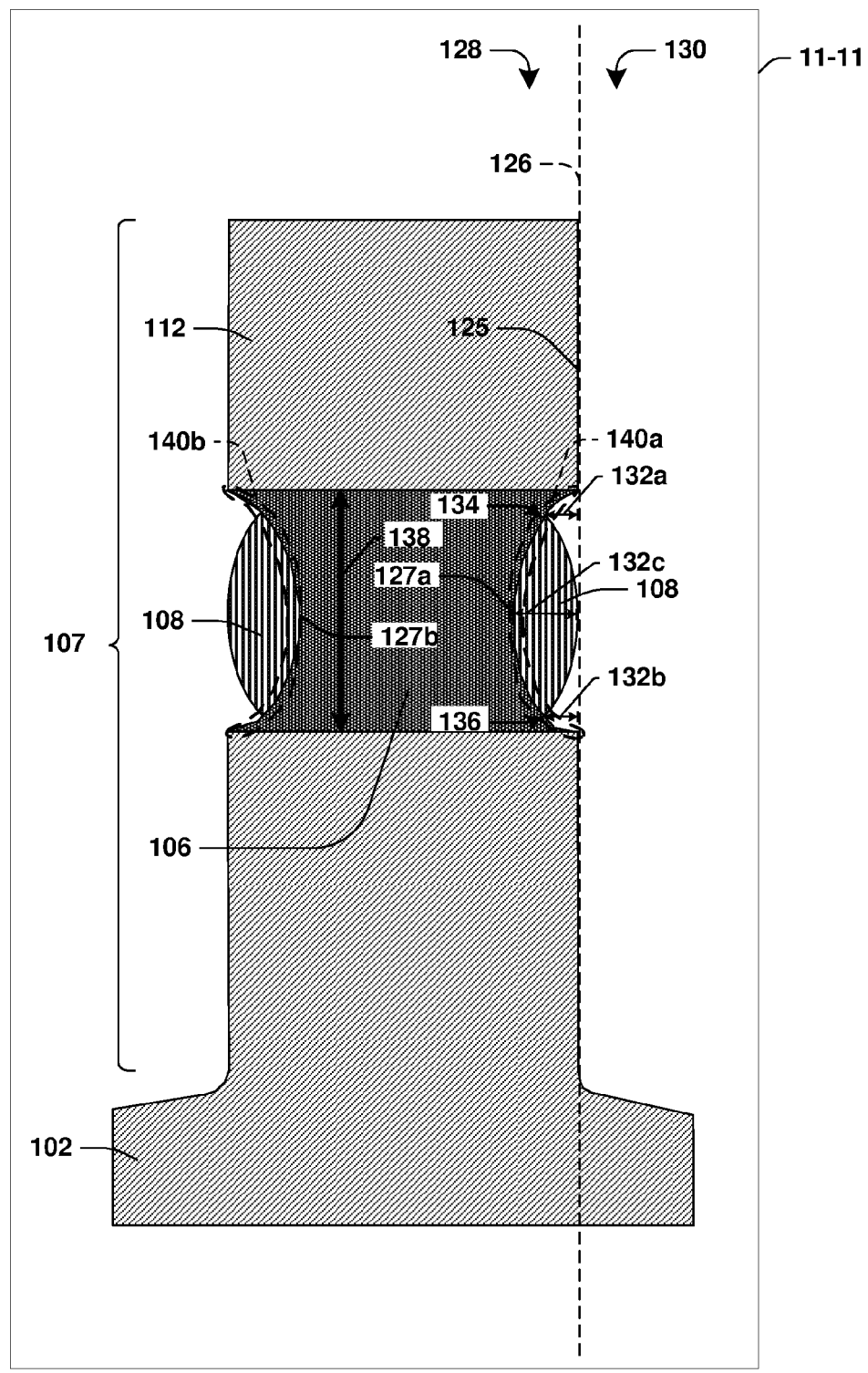
FIG. 11 is an illustration of a cross section of a semiconductor device at a stage of fabrication, in accordance with some embodiments.

Turning to FIGS. 9-11, a portion of the dielectric feature 108 is removed, according to some embodiments. With reference to FIG. 11, which is a magnified fin or zoomed in view of the fin 107 encompassed by dashed box 11-11 of FIG. 9, the dielectric feature 108 is disposed in the first furrow 127*a*, according to some embodiments. In some embodiments, the portion of the dielectric feature 108 is removed by etching.

According to some embodiments, the dielectric feature 108 is disposed within the first furrow 127*a* such that the dielectric feature 108 is in contact with the first furrow 127*a* between a first end 134 of the dielectric feature 108 and a second end 136 of the dielectric feature 108. In some embodiments, the removal of the portion of the dielectric feature 108 exposes at least a portion of the first outer surface 140*a*. In some embodiments, the first end 134 is separated a first distance 132*a* from the first plane 126. In some embodiments, the second end 136 is separated a second distance 132*b* from the first plane 126. In some embodiments, the first distance 132*a* and the second distance 132*b* are substantially equal. In some embodiments, the first distance 132*a* is between about 0.5 nm to about 10 nm. In some embodiments, the dielectric feature 108 is convex, such that an outer most protruding point of the dielectric feature 108 is at least one of even with the first plane 126, on the first side 128 of the first plane 126 or on the second side 130 of the first plane 126. In some embodiments, the dielectric feature 108 has a dielectric thickness 132*c*, the dielectric thickness 132*c* measured from a portion of the first furrow 127*a* nearest the second furrow 127*b* to the outer most protruding point of the dielectric feature 108. In some embodiments, the dielectric thickness 132*c* is between about 0.5 nm to about 10 nm. In some embodiments, the dielectric feature 108, or a second instance of the dielectric feature, is disposed in the second furrow 127*b* in substantially the same manner as the dielectric feature 108 is disposed in the first furrow 127*a*. In some embodiments, the oxidation layer (not shown) is removed from the surface of the substrate 102 and the surface of the second substrate layer 112 during the removal of the portion of the dielectric feature 108. In some embodiments, the fin hard mask 122 and the mask layer 109 are removed, such as by etching. In some embodiments, the fin hard mask 122 and the mask layer 109 are removed after the oxidation layer is removed.

Figure 12:
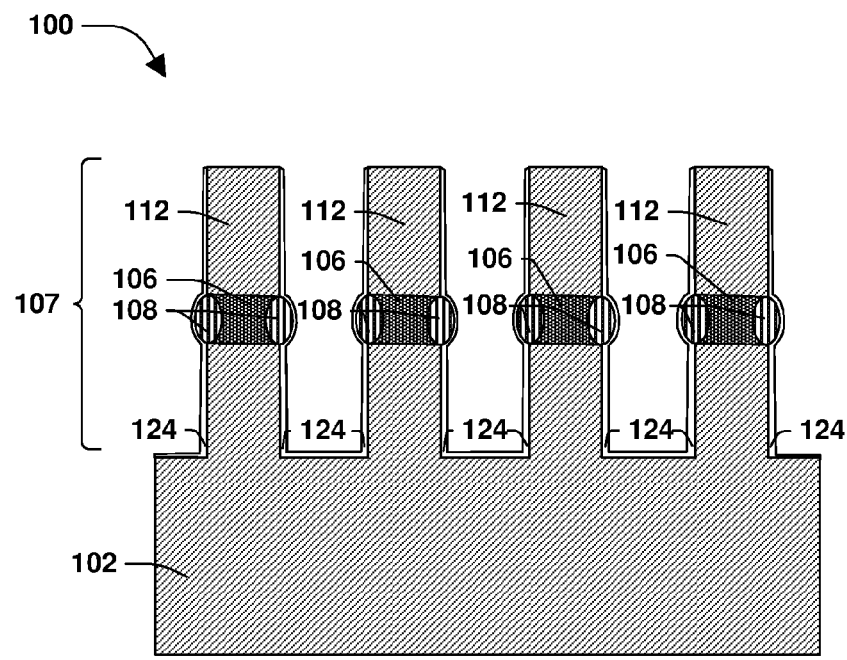
FIG. 12 is an illustration of a cross section of a semiconductor device at a stage of fabrication, in accordance with some embodiments.
Figure 13:
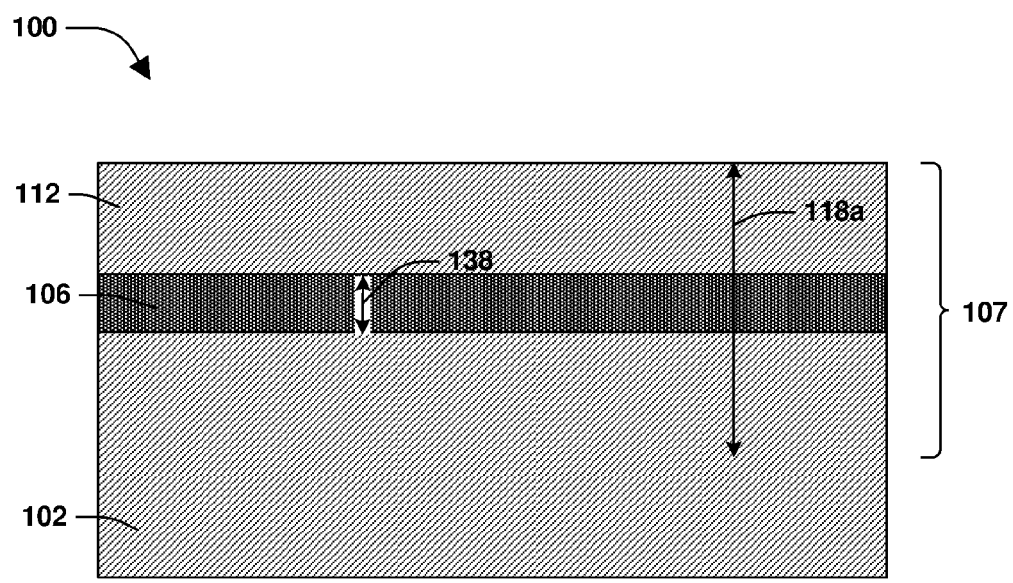
FIG. 13 is an illustration of a cross section of a semiconductor device at a stage of fabrication, in accordance with some embodiments.

Turning to FIGS. 12-13, the dielectric layer 124 is formed over the fin 107, according to some embodiments. Although the dielectric layer 124 is illustrated as being over the fin 107 having the dielectric feature 108 depicted in FIG. 6, the dielectric layer 124 is formed over the fin 107 having the dielectric feature 108 depicted in FIG. 9 or over the fin 107 having no dielectric feature 108 as depicted in FIG. 4, according to some embodiments. In some embodiments, the dielectric layer 124 is formed over the fin 107 having no doped region 106. In some embodiments, the dielectric layer 124 comprises at least one of oxide, nitride, silicon, aluminum, silicon nitride, aluminum oxide, silicon oxy nitride, etc. In some embodiments, the dielectric layer 124 is formed by at least one of growth, deposition, etc. In some embodiments, the dielectric layer 124 is formed by at least ALD, PVD, CVD, etc. In some embodiments, the mask layer 109 and the fin hard mask 122 are removed by at least one of etching, chemical mechanical planarization (CMP), etc. In some embodiments, the mask layer 109 and the fin hard mask 122 are removed after the dielectric layer 124 is formed, and thus a portion of the dielectric layer 124 formed over the mask layer 109 and the fin hard mask 122 is removed when the mask layer 109 and the fin hard mask 122 are removed. In some embodiments, the mask layer 109 and the fin hard mask 122 are removed before the dielectric layer 124 is formed, and a portion of the dielectric layer 124 is then removed from a top surface of the fin 107, such as by CMP.

Figure 14:
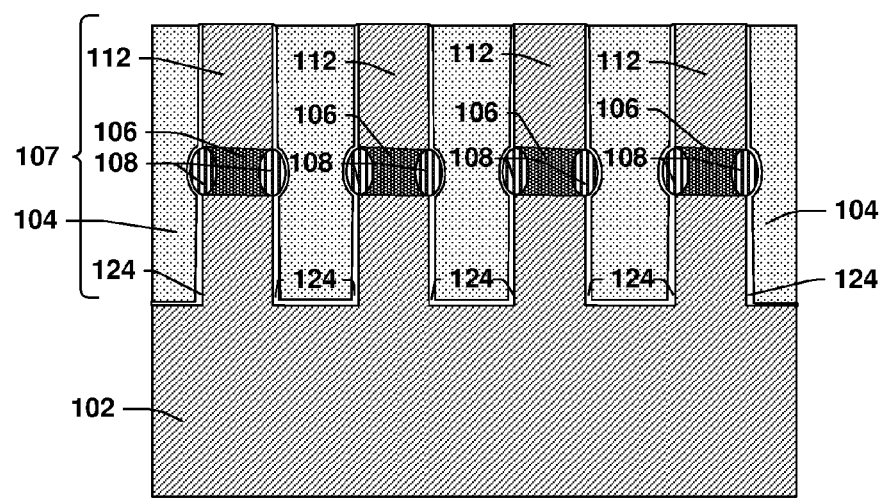
FIG. 14 is an illustration of a cross section of a semiconductor device at a stage of fabrication, in accordance with some embodiments.
Figure 15:
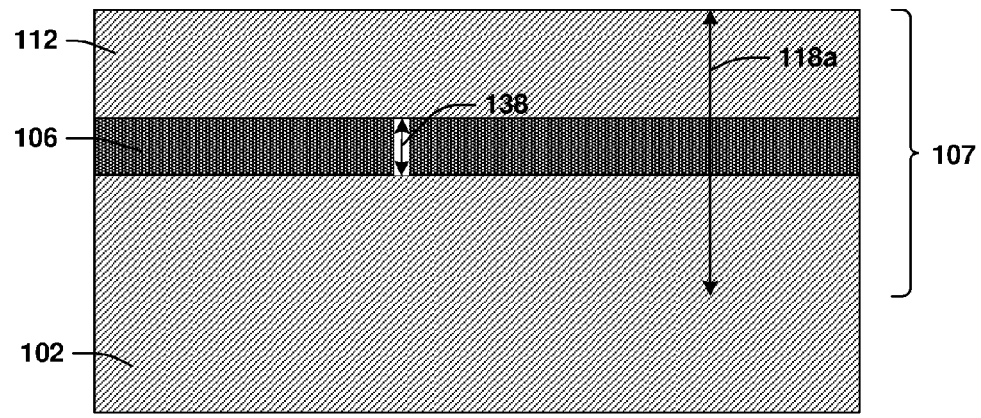
FIG. 15 is an illustration of a cross section of a semiconductor device at a stage of fabrication, in accordance with some embodiments.

Turning to FIGS. 14-15, the ILD layer 104 is formed on the dielectric layer 124, according to some embodiments. In some embodiments, the ILD layer 104 and the dielectric layer 124 are recessed. In some embodiments, the ILD layer 104 comprises a high dielectric constant material, such as at least one of oxide, nitride, etc. In some embodiments, the ILD layer 104 is at least one of grown, deposited, etc. In some embodiments, the ILD layer 104 is formed by deposition in a furnace.

Figure 16:
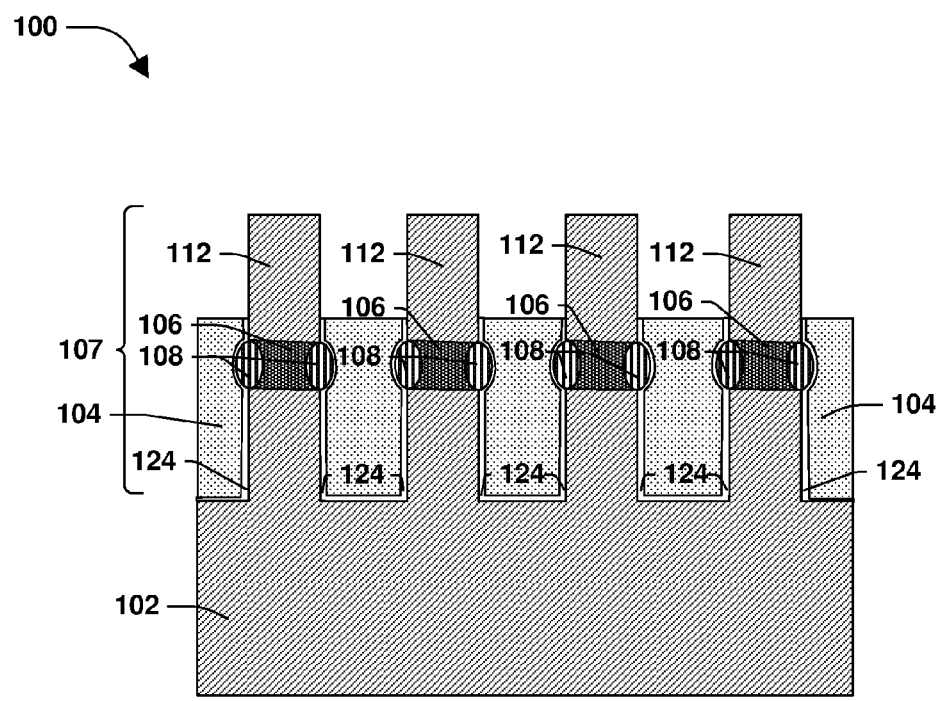
FIG. 16 is an illustration of a cross section of a semiconductor device at a stage of fabrication, in accordance with some embodiments.
Figure 17:
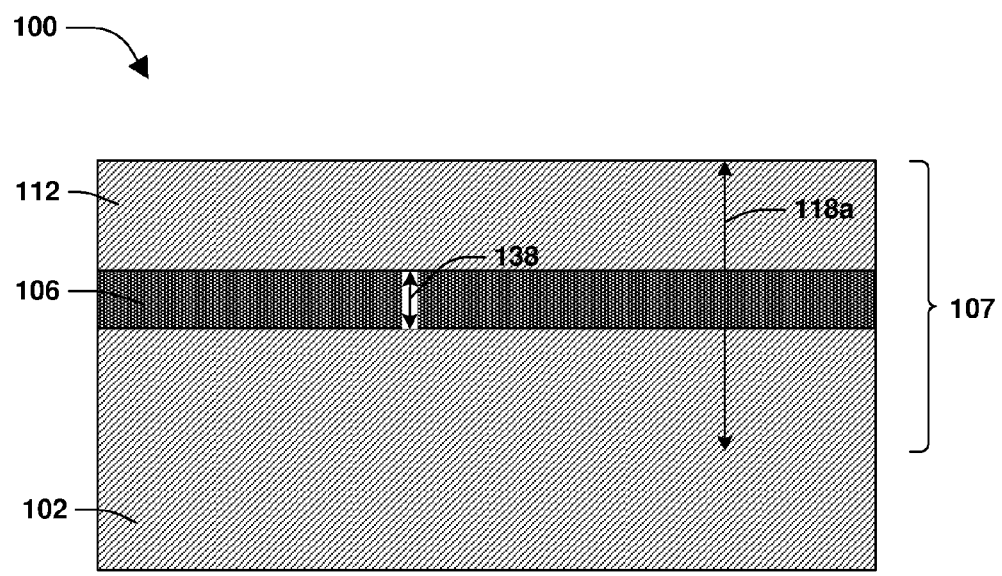
FIG. 17 is an illustration of a cross section of a semiconductor device at a stage of fabrication, in accordance with some embodiments.

Turning to FIGS. 16-17, at least one of the ILD layer 104 or the dielectric layer 124 is recessed, according to some embodiments. In some embodiments, the ILD layer 104 and the dielectric layer 124 are recessed by at least one of a chemical etch comprising fluorine, CMP, etc. In some embodiments, the ILD layer 104 and the dielectric layer 124 are recessed such that at least the top surface of the fin 107 or a sidewall of the fin 107 is exposed. In some embodiments, prior to recessing the ILD layer 104, a top portion of the fin 107 comprising at least some of the second substrate layer 112, is removed and a layer of doped material (not shown) is formed over the fin 107. In some embodiments, the layer of doped material comprises at least one of silicon, germanium, etc.

Figure 18:
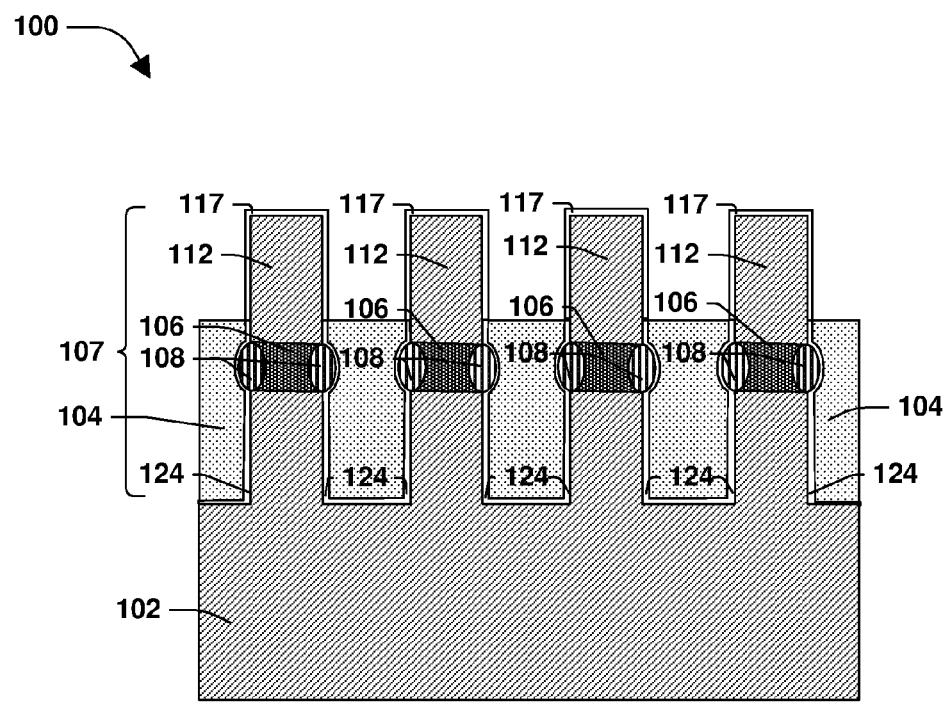
FIG. 18 is an illustration of a cross section of a semiconductor device at a stage of fabrication, in accordance with some embodiments.
Figure 19:
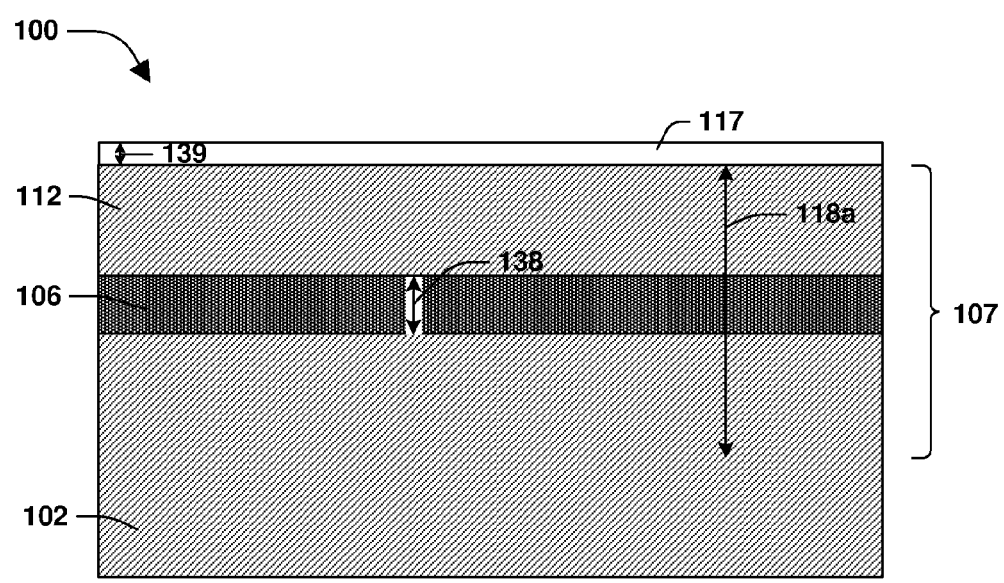
FIG. 19 is an illustration of a cross section of a semiconductor device at a stage of fabrication, in accordance with some embodiments.

Turning to FIGS. 18-19, the dielectric material 117 is formed over surfaces of the fin 107 that are exposed, according to some embodiments. In some embodiments, the dielectric material 117 comprises at least one of silicon nitride, aluminum oxide, silicon oxy nitride, etc. In some embodiments, the dielectric material 117 is at least one of grown, deposited, etc. In some embodiments, the dielectric material 117 is formed by at least one of ALD, PVD, CVD, etc. In some embodiments, the dielectric material 117 has a dielectric thickness 139 between about 2 nm to about 7 nm. In some embodiments, the dielectric material 117 is formed at a first temperature between about 400° C. to about 500° C.

Figure 20:
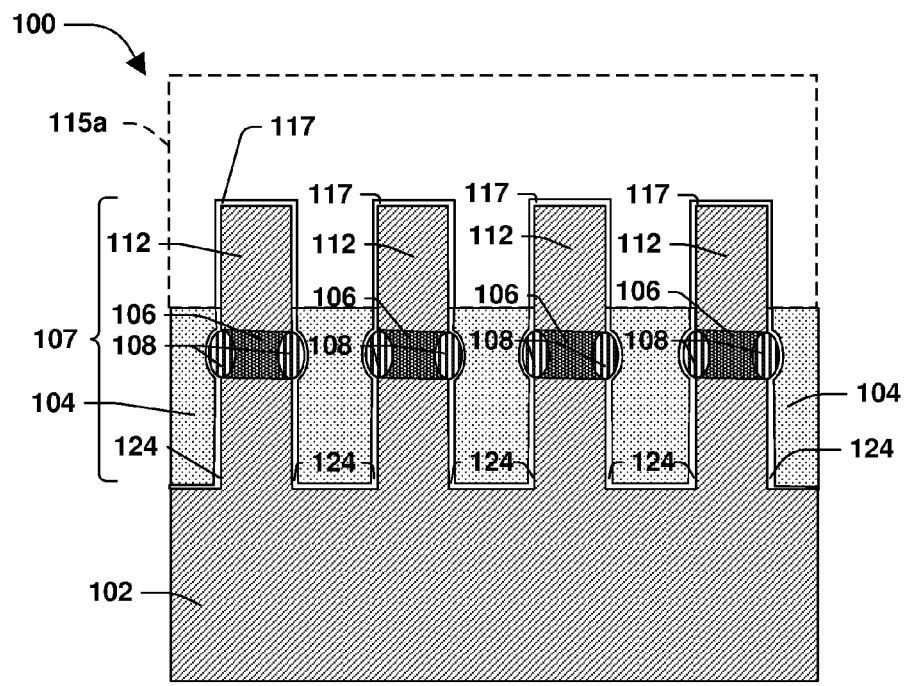
FIG. 20 is an illustration of a cross section of a semiconductor device at a stage of fabrication, in accordance with some embodiments.
Figure 21:
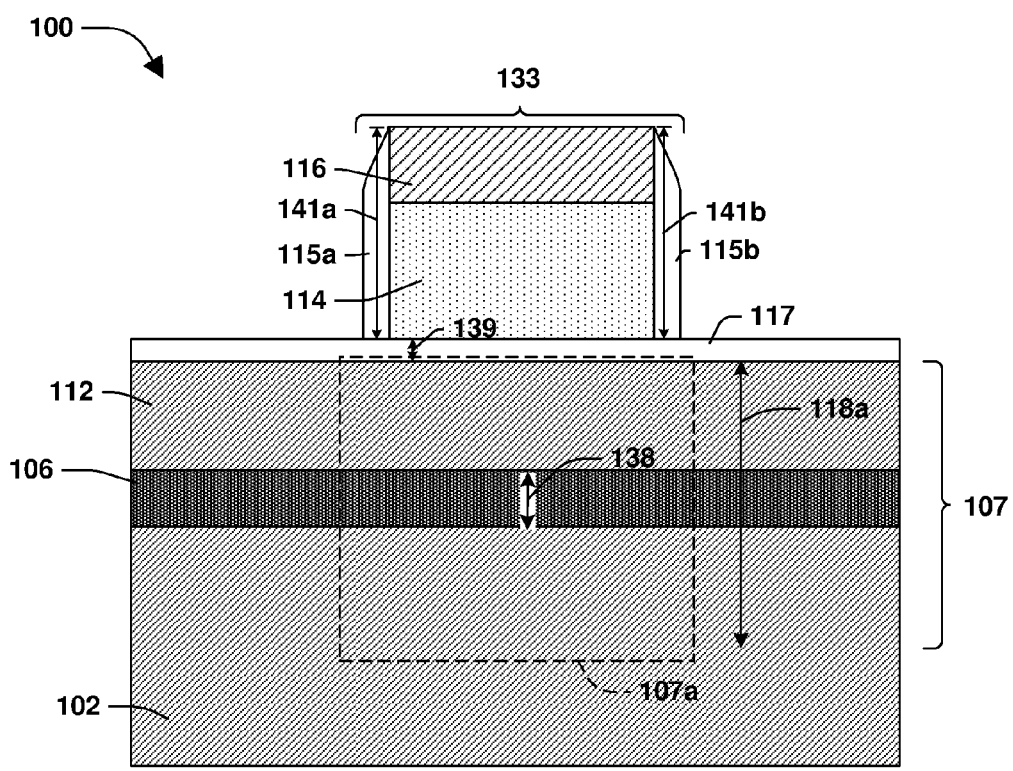
FIG. 21 is an illustration of a cross section of a semiconductor device at a stage of fabrication, in accordance with some embodiments.

Turning to FIGS. 20-21, a dummy gate 133 is formed over the channel portion 107a of the fin 107, according to some embodiments. In some embodiments, forming the dummy gate 133 comprises forming a layer of dummy poly material over the fin 107 and forming a layer of hard mask material over the dummy poly material. In some embodiments, the layer of hard mask material is patterned to form a hard mask 116. In some embodiments, the layer of dummy poly material is patterned to form a dummy poly 114 under the hard mask 116. In some embodiments, the layer of dummy poly material is at least one of grown, deposited, etc. In some embodiments, the dummy poly 114 comprises an inert material, such as poly silicon. In some embodiments, the layer of hard mask material is at least one of grown, deposited, etc. In some embodiments, the hard mask 116 comprises at least one of oxide, nitride, etc. In some embodiments, the initial first sidewall spacer 115a is formed adjacent the dummy poly 114 and the hard mask 116 and the initial second sidewall spacer 115b is formed opposite the initial first sidewall spacer 115a across the dummy poly 114 and the hard mask 116. In some embodiments, at least one of the initial first sidewall spacer 115a or the initial second sidewall spacer 115b is formed by at least one of growth, deposition, etc. In some embodiments, at least one of the initial first sidewall spacer 115a or the initial second sidewall spacer 115b comprises at least one of silicon, carbon, nitride, etc. In some embodiments, the initial first sidewall spacer 115a has an initial first height 141a between about 14 nm to about 49 nm. In some embodiments, the initial second sidewall spacer 115b has an initial second height 141b between about 14 nm to about 49 nm. In some embodiment, the dummy gate 133 comprises the initial first sidewall spacer 115a, the initial second sidewall spacer 115b, the dummy poly 114, and the hard mask 116.

Figure 22:
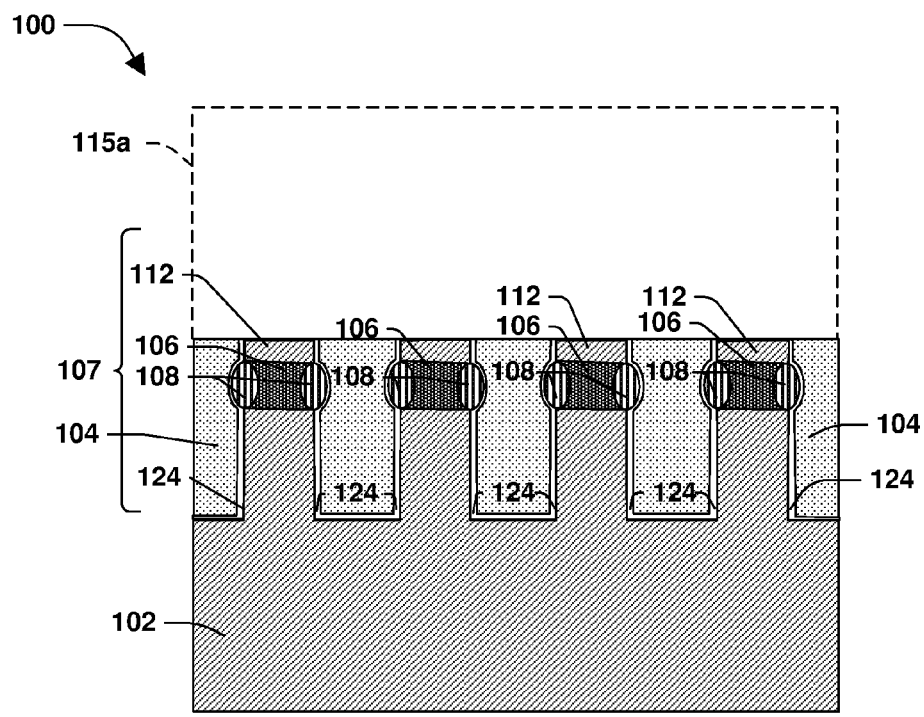
FIG. 22 is an illustration of a cross section of a semiconductor device at a stage of fabrication, in accordance with some embodiments.
Figure 23:
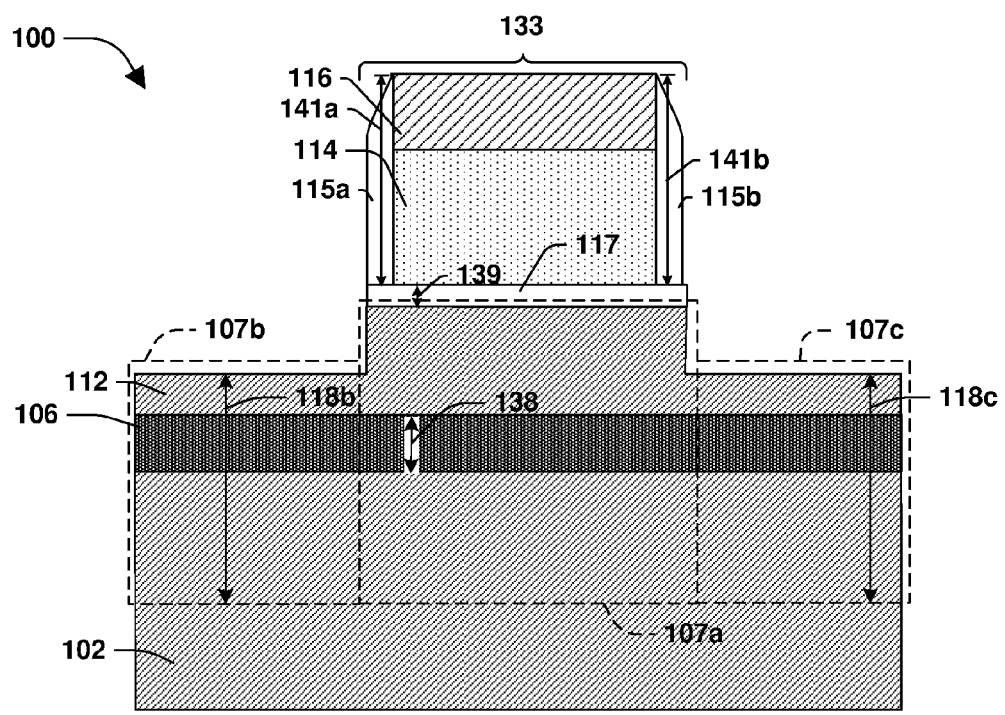
FIG. 23 is an illustration of a cross section of a semiconductor device at a stage of fabrication, in accordance with some embodiments.

Turning to FIGS. 22-23, the fin height 118a of the first non-channel portion 107b of the fin 107 and the fin height 118a of a second non-channel portion 107c of the fin 107 are reduced, according to some embodiments. In some embodiments, reducing the fin height 118a of at least one of the first non-channel portion 107b or the second non-channel portion 107c comprises removing at least some of the dielectric material 117 over at least one of the first non-channel portion 107b or the second non-channel portion 107c. In some embodiments, reducing the fin height 118a of at least one of the first non-channel portion 107b or the second non-channel portion 107c comprises removing at least some of the second substrate layer 112 over at least one of the first non-channel portion 107b or the second non-channel portion 107c. In some embodiments, a first reduced fin height 118b of the first non-channel portion 107b of the fin 107 is between about 80 nm to about 100 nm. In some embodiments, a second reduced fin height 118c of the second non-channel portion 107c of the fin 107 is between about 80 nm to about 100 nm. In some embodiments, the fin height 118a of at least one of the first non-channel portion 107b of the fin 107 or the second non-channel portion 107c of the fin 107 is reduced by etching, such as dry etching. In some embodiments, the fin height 118a of at least one of the first non-channel portion 107b of the fin 107 or the second non-channel portion 107c of the fin 107 is reduced such that at least one of the first non-channel portion 107b or the second non-channel portion 107c is at least one of below a top surface of the ILD layer 104, even with the top surface of the ILD layer 104, or above the top surface of the ILD layer 104.

Figure 24:
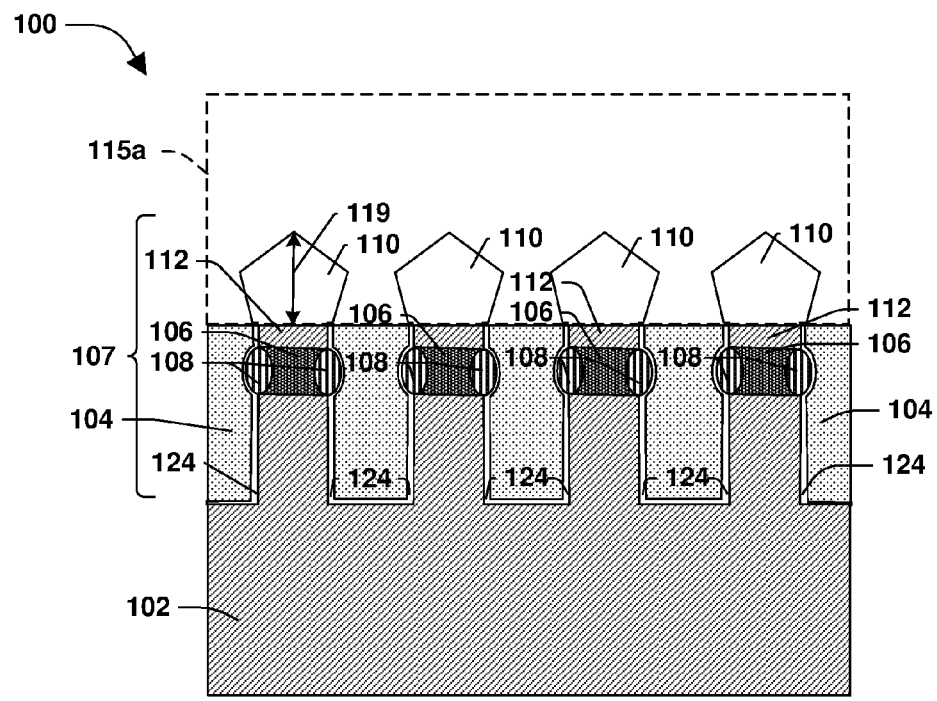
FIG. 24 is an illustration of a cross section of a semiconductor device at a stage of fabrication, in accordance with some embodiments.
Figure 25:
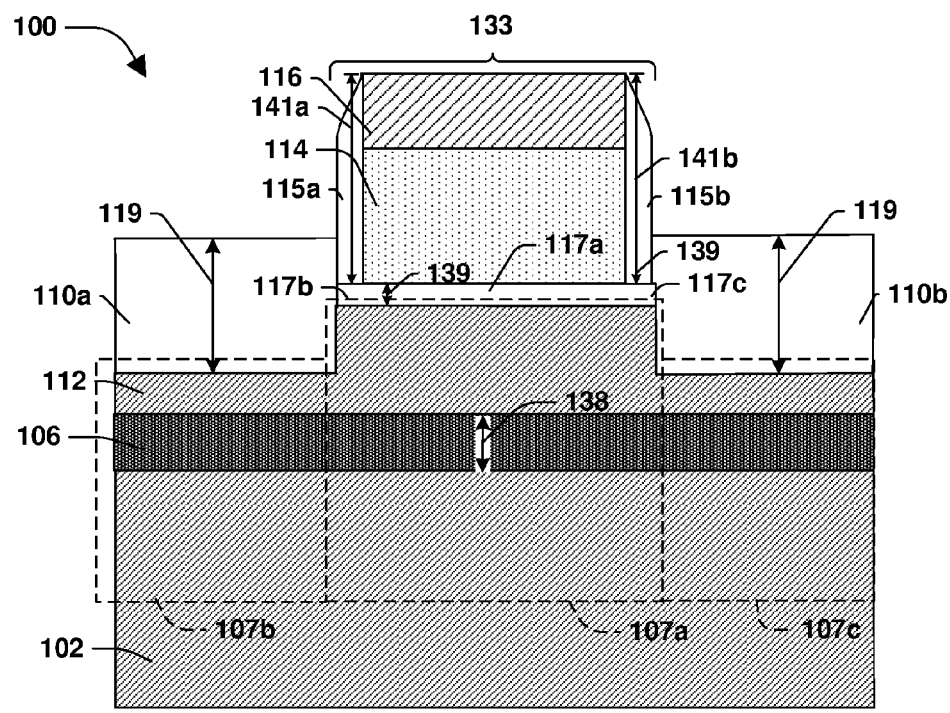
FIG. 25 is an illustration of a cross section of a semiconductor device at a stage of fabrication, in accordance with some embodiments.
Figure 26:
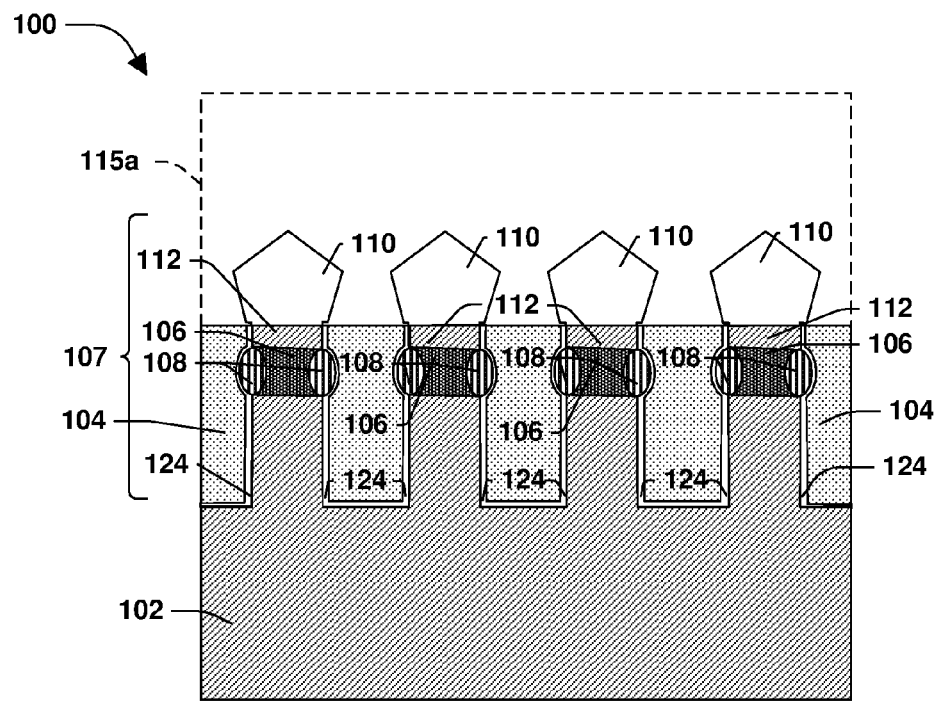
FIG. 26 is an illustration of a cross section of a semiconductor device at a stage of fabrication, in accordance with some embodiments.
Figure 27:
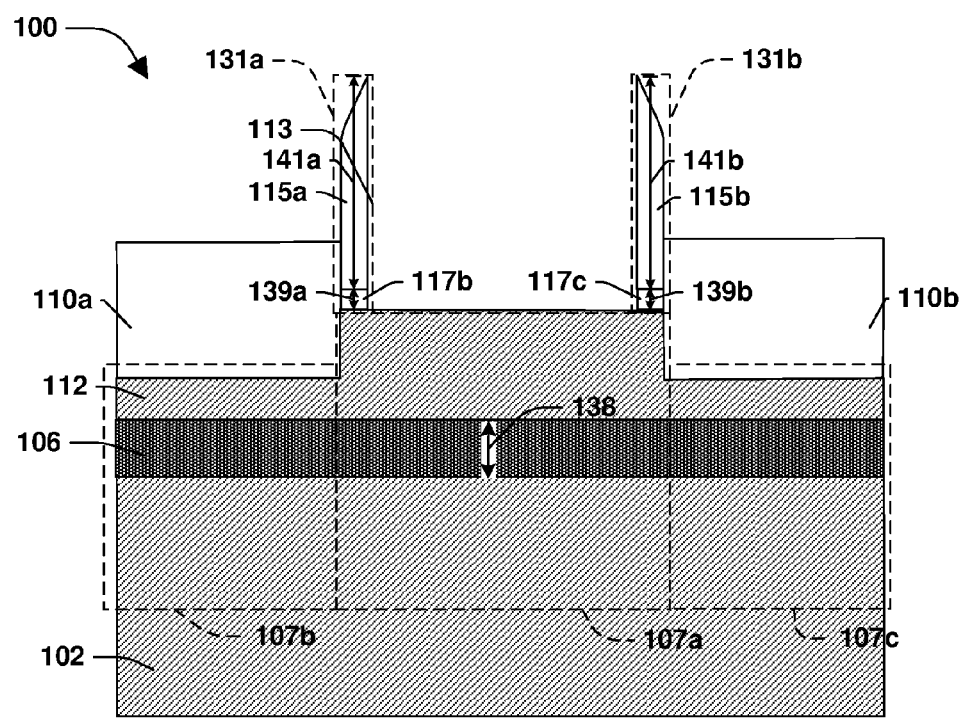
FIG. 27 is an illustration of a cross section of a semiconductor device at a stage of fabrication, in accordance with some embodiments.

Turning to FIGS. 24-25, a first epi cap 110a is formed over the first non-channel portion 107b and a second epi cap 110b is formed over the second non-channel portion 107c, according to some embodiments. In some embodiments, the first epi cap 110a and the second epi cap 110b are referred to generically as the epi cap 110. In some embodiments, the epi cap 110 is formed adjacent the dummy gate 133. In some embodiments, the epi cap 110 is grown, such as by epitaxial growth. In some embodiments, the epi cap 110 comprises at least one of a source or a drain. In some embodiments, the epi cap 110 comprises at least one of silicon, germanium, etc. In some embodiments, the epi cap 110 has an epi cap height 119 measured from a top most portion of the epi cap 110 to the top surface of the fin 107. In some embodiments, the epi cap height is between about 10 nm to about 50 nm Turning to FIGS. 26-27, the hard mask 116, the dummy poly 114 and a portion 117a of the dielectric material 117 under the dummy poly 114 between the initial first sidewall spacer 115a and the initial second sidewall spacer 115b is removed to form the first sidewall spacer 131a comprising the first portion 117b of the dielectric material 117 under the initial first sidewall spacer 115a and the initial first sidewall spacer 115a and to form the second sidewall spacer 131b comprising the second portion 117c of the dielectric material 117 under the initial second sidewall spacer 115b and the initial second sidewall spacer 115b, according to some embodiments. In some embodiments, the hard mask 116, the dummy poly 114 and the portion 117*a* of the dielectric material 117 are removed by etching. In some embodiments, the removal of the hard mask 116, the dummy poly 114 and the portion 117*a* of the dielectric material 117 exposes the top surface of the channel portion 107*a*. In some embodiments, the first portion 117*b* has a first portion height 139*a* between about 2 nm to about 7 nm. In some embodiments, a ratio of the first portion height 139*a* to the initial first height 141*a* is between about 6 to about 9. In some embodiments, the second portion 117*c* has a second portion height 139*b* between about 2 nm to about 7 nm. In some embodiments, a ratio of the second portion height 139*b* to the initial second height 141*b* is between about 6 to about 9.

Turning to FIGS. 28-29, the gate 132 is formed over the channel portion 107*a* of the fin 107, according to some embodiments. In some embodiments, the gate 132 comprises the first sidewall spacer 131*a*, the second sidewall spacer 131*b*, the gate dielectric 113 between the first sidewall spacer 131*a* and the second sidewall spacer 131*b*, and the gate electrode 111 over the gate dielectric 113. In some embodiments, the gate dielectric 113 is formed by at least one of growth, deposition, etc. In some embodiments, the gate dielectric 113 is formed by at least one of ALD, CVD, PVD, etc. In some embodiments, the gate dielectric 113 comprises a high dielectric constant material. In some embodiments, the gate electrode 111 is formed over the gate dielectric 113. In some embodiments, the gate electrode 111 is formed by at least one of growth, deposition, etc. In some embodiments, the gate electrode 111 is formed by at least one of ALD, CVD, PVD, etc. In some embodiments, the gate electrode 111 comprises a conductive material, such as metal, metalloid, doped material, etc. In some embodiments, the dielectric material 117 inhibits dopant migration during at least one of dummy gate formation, epi cap formation, etching to reduce the fin height, etc. In some embodiments, inhibiting dopant migration forms a more uniform channel than a device that does not inhibit dopant migration. In some embodiments, a more uniform channel corresponds to a more uniform or non-varying composition of one or more materials within the channel portion 107*a* of the fin 107 between a source region and a drain region, such as between the first epi cap 110*a* and the second epi cap 110*b*.

According to some embodiments, a semiconductor device comprises a fin comprising a doped region and a gate over a channel portion of the fin. In some embodiments, the gate comprises a gate electrode over a gate dielectric between a first sidewall spacer and a second sidewall spacer. In some embodiments, the first sidewall spacer comprises an initial first sidewall spacer over a first portion of a dielectric material. In some embodiments, the dielectric material comprises at least one of silicon nitride, aluminum oxide or silicon oxy nitride. In some embodiments, the second sidewall spacer comprises an initial second sidewall spacer over a second portion of the dielectric material.

According to some embodiments, a method of forming a semiconductor device comprises forming a doped region in a fin, oxidizing the fin, such that a dielectric feature is on an outer surface of the doped region, and forming a dielectric material over the fin. In some embodiments, the dielectric material comprises at least one of silicon nitride, aluminum oxide or silicon oxy nitride. According to some embodiments, the method of forming a semiconductor device comprises forming a dummy gate over at least some of the dielectric material over a channel portion of the fin. In some embodiments, the dummy gate comprises an initial first sidewall spacer adjacent a dummy poly and an initial second sidewall spacer adjacent the dummy poly. According to some embodiments, the method of forming a semiconductor device comprises removing the dummy poly and a portion of the dielectric material from between the initial first sidewall spacer and the initial second sidewall spacer to form a first sidewall spacer comprising a first portion of the dielectric material under the initial first sidewall spacer and the initial first sidewall spacer and to form a second sidewall spacer comprising a second portion of the dielectric material under the initial second sidewall spacer and the initial second sidewall spacer. According to some embodiments, the method of forming a semiconductor device comprises forming a gate dielectric between the first sidewall spacer and the second sidewall spacer and forming a gate electrode over the gate dielectric.

According to some embodiments, a semiconductor device comprises a fin comprising a doped region and a dielectric feature on an outer surface of the doped region. In some embodiments, a gate is over a channel portion of the fin. In some embodiments, the gate comprises a gate electrode over a gate dielectric between a first sidewall spacer and a second sidewall spacer. In some embodiments, the first sidewall spacer comprises an initial first sidewall spacer over a first portion of a dielectric material, the dielectric material comprising at least one of silicon nitride, aluminum oxide, or silicon oxy nitride. In some embodiments, the initial first sidewall spacer has an initial first height and the first portion has a first portion height. In some embodiments, a ratio of the first portion height to the initial first height is between about 6 to about 9. In some embodiments, the second sidewall spacer comprises an initial second sidewall spacer over a second portion of the dielectric material. In some embodiments, the initial second sidewall spacer has an initial second height and the second portion has a second portion height. In some embodiments, a ratio of the second portion height to the initial second height is between about 6 to about 9.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device comprising:
   forming a doped region in a fin;
   oxidizing the fin to form a dielectric feature on an outer surface of the doped region;
   forming a dielectric layer over the fin, the dielectric layer comprising at least one of silicon nitride, aluminum oxide or silicon oxy nitride;
   forming a dummy gate over at least some of the dielectric layer and over a channel portion of the fin, the dummy gate comprising:
   a dummy poly;
   a first sidewall spacer; and
   a second sidewall spacer, wherein:
      the dummy poly is disposed between the first sidewall spacer and the second sidewall spacer, and
      the dummy poly, the first sidewall spacer, and the second sidewall spacer overlie the dielectric layer;
   removing the dummy poly and a portion of the dielectric layer underlying the dummy poly to define an opening;
   forming a gate dielectric in the opening between the first sidewall spacer and the second sidewall spacer; and
   forming a gate electrode in the opening over the gate dielectric.

2. The method of claim 1, wherein the doped region forms a concave surface at an interface of the doped region and the dielectric feature.

3. The method of claim 2, comprising:
   etching the dielectric feature to expose a portion of the concave surface prior to forming the dielectric layer.

4. The method of claim 1, comprising:
   etching a non-channel portion of the fin after forming the dummy gate to reduce a height of the non-channel portion of the fin.

5. The method of claim 4, comprising forming an epitaxial (epi) cap over the non-channel portion of the fin, wherein the epi cap is in contact with the channel portion of the fin.

6. The method of claim 1, wherein forming the doped region comprises:
   doping an upper portion of a silicon substrate with germanium.

7. The method of claim 6, comprising:
   forming a second silicon substrate over the doped region to sandwich the doped region between a lower portion of the silicon substrate and the second silicon substrate.

8. The method of claim 7, wherein oxidizing the fin further forms an oxide layer over at least one of the lower portion of the silicon substrate or the second silicon substrate.

9. The method of claim 8, comprising:
   removing the oxide layer to expose a sidewall of the at least one of the lower portion of the silicon substrate or the second silicon substrate prior to forming the dielectric layer.

10. A method of forming a semiconductor device comprising:
    forming a doped region in a fin;
    oxidizing the fin to form a dielectric feature on an outer surface of the doped region;
    forming a dielectric layer over the fin; and
    forming a dummy gate over at least some of the dielectric layer and over a channel portion of the fin, the dummy gate comprising:
    a dummy poly;
    a first sidewall spacer; and
    a second sidewall spacer, wherein:
       the dummy poly is disposed between the first sidewall spacer and the second sidewall spacer, and
       the dummy poly, the first sidewall spacer, and the second sidewall spacer overlie the dielectric layer.

11. The method of claim 10, comprising:
    removing the dummy poly and a first portion of the dielectric layer underlying the dummy poly to define an opening, wherein a second portion of the dielectric layer underlying the first sidewall spacer and the second sidewall spacer remains intact.

12. The method of claim 11, comprising:
    forming a gate dielectric in the opening between the first sidewall spacer and the second sidewall spacer, wherein the gate dielectric is laterally coincident with the second portion of the dielectric layer.

13. The method of claim 12, wherein the gate dielectric is also laterally coincident contact with the first sidewall spacer and the second sidewall spacer.

14. The method of claim 10, comprising:
   forming a first portion of the dielectric layer;
   forming an interlayer dielectric (ILD) adjacent the fin;
   etching the ILD and some of the first portion of the dielectric layer to define a recess; and
   forming a second portion of the dielectric layer in the recess.

15. The method of claim 10, wherein the doped region forms a concave surface at an interface of the doped region and the dielectric feature.

16. The method of claim 15, comprising:
   etching the dielectric feature to expose a portion of the concave surface prior to forming the dielectric layer.

17. The method of claim 10, comprising:
   etching a non-channel portion of the fin after forming the dummy gate to reduce a height of the non-channel portion of the fin.

18. The method of claim 17, comprising forming an epitaxial (epi) cap over the non-channel portion of the fin, wherein the epi cap is in contact with the channel portion of the fin.

19. A method of forming a semiconductor device comprising:
   forming a fin;
   forming a dielectric layer over the fin;
   forming a dummy gate over at least some of the dielectric layer and over a channel portion of the fin, the dummy gate comprising:
      a dummy poly;
      a first sidewall spacer; and
      a second sidewall spacer, wherein:
         the dummy poly is disposed between the first sidewall spacer and the second sidewall spacer, and
         the dummy poly, the first sidewall spacer, and the second sidewall spacer overlie the dielectric layer;
   removing the dummy poly and a portion of the dielectric layer underlying the dummy poly to define an opening;
   forming a gate dielectric in the opening between the first sidewall spacer and the second sidewall spacer; and
   forming a gate electrode in the opening over the gate dielectric.

20. The method of claim 19, wherein the gate dielectric is laterally coincident with the first sidewall spacer, the second sidewall spacer, and a second portion of the dielectric layer underlying the first sidewall spacer and the second sidewall spacer.

* * * * *